United States Patent
Wang et al.

(10) Patent No.: US 12,446,359 B2
(45) Date of Patent: Oct. 14, 2025

(54) EPITAXIAL STRUCTURE AND MICRO LIGHT EMITTING DEVICE

(71) Applicant: PlayNitride Display Co., Ltd., MiaoLi County (TW)

(72) Inventors: Shen-Jie Wang, MiaoLi County (TW); Kuang-Yuan Hsu, MiaoLi County (TW)

(73) Assignee: PlayNitride Display Co., Ltd., MiaoLi County (TW)

(*) Notice: Subject to any disclaimer, the term of this patent is extended or adjusted under 35 U.S.C. 154(b) by 697 days.

(21) Appl. No.: 17/732,523

(22) Filed: Apr. 29, 2022

(65) Prior Publication Data

US 2023/0043942 A1 Feb. 9, 2023

(30) Foreign Application Priority Data

Aug. 3, 2021 (TW) .................. 110128528

(51) Int. Cl.
*H10H 20/812* (2025.01)
*H10H 20/81* (2025.01)
*H10H 20/815* (2025.01)
*H10H 20/821* (2025.01)
*H10H 20/825* (2025.01)

(52) U.S. Cl.
CPC ........ *H10H 20/812* (2025.01); *H10H 20/821* (2025.01); *H10H 20/8215* (2025.01); *H10H 20/815* (2025.01); *H10H 20/8252* (2025.01)

(58) Field of Classification Search
CPC ............... H10H 20/812; H10H 20/821; H10H 20/8215; H10H 20/815
See application file for complete search history.

(56) References Cited

U.S. PATENT DOCUMENTS

| | | | |
|---|---|---|---|
| 2012/0012814 A1 | 1/2012 | Harada et al. | |
| 2017/0324047 A1* | 11/2017 | Fujiwara | H10H 20/821 |
| 2018/0083160 A1 | 3/2018 | Meyer et al. | |
| 2019/0165209 A1 | 5/2019 | Bonar et al. | |
| 2021/0143299 A1 | 5/2021 | Cho et al. | |

FOREIGN PATENT DOCUMENTS

| | | |
|---|---|---|
| CN | 1893128 | 1/2007 |
| CN | 103280504 | 9/2013 |
| CN | 107004742 | 8/2017 |
| TW | 202118080 | 5/2021 |

OTHER PUBLICATIONS

Office Action of Taiwan Counterpart Application, issued on Jul. 18, 2022, pp. 1-5.
Office Action of China Counterpart Application, issued on Jul. 29, 2022, pp. 1-9.

* cited by examiner

*Primary Examiner* — Amar Movva
(74) *Attorney, Agent, or Firm* — JCIPRNET

(57) ABSTRACT

An epitaxial structure includes a quantum well structure, a first type semiconductor layer, and a second type semiconductor layer. The quantum well structure has an upper surface and a lower surface opposite to each other and includes at least one quantum well layer and at least one quantum barrier layer stacked alternately. The quantum well layer includes at least one patterned layer, and the patterned layer includes multiple geometric patterns. The first type semiconductor layer is disposed on the lower surface of the quantum well structure. The second type semiconductor layer is disposed on the upper surface of the quantum well structure.

18 Claims, 9 Drawing Sheets

EPITAXIAL STRUCTURE AND MICRO LIGHT EMITTING DEVICE

CROSS-REFERENCE TO RELATED APPLICATION

This application claims the priority benefit of Taiwan application serial no. 110128528, filed on Aug. 3, 2021. The entirety of the above-mentioned patent application is hereby incorporated by reference herein and made a part of this specification.

BACKGROUND

Technology Field

The disclosure relates to a semiconductor structure, and more particularly, to an epitaxial structure and a micro light emitting device having the epitaxial structure.

Description of Related Art

Generally, when an epitaxial structure is grown on an inclined crystal plane, the misfit and threading dislocation from the grown crystal can be suppressed, thereby obtaining higher luminous efficiency. However, when the inclined crystal plane is fabricated, the epitaxial process has to be interrupted first, so that a SixNy mask for selective epitaxial growth can be fabricated through additional exposure and development processes. In addition, with the steps, only a single quantum well layer can be produced, and finally a P-type semiconductor layer formed with a thickness of at least 250 nm to 500 nm is required to flatten the surface of the epitaxial structure.

SUMMARY

The disclosure provides an epitaxial structure with favorable yield and quality.

The disclosure also provides a micro light emitting device, which includes the epitaxial structure and has good optoelectronic properties and reliability.

The epitaxial structure of the disclosure includes a quantum well structure, a first type semiconductor layer, and a second type semiconductor layer. The quantum well structure has an upper surface and a lower surface opposite to each other and includes at least one quantum well layer and at least one quantum barrier layer stacked alternately. The quantum well layer includes at least one patterned layer, and the patterned layer includes multiple geometric patterns. A first type semiconductor layer is disposed on the lower surface of the quantum well structure. A second type semiconductor layer is disposed on the upper surface of the quantum well structure.

The micro light emitting device of the disclosure includes an epitaxial structure, a first type electrode, and a second type electrode. The epitaxial structure includes a quantum well structure, a first type semiconductor layer, and a second type semiconductor layer. The quantum well structure has an upper surface and a lower surface opposite to each other and includes at least one quantum well layer and at least one quantum barrier layer stacked alternately. The quantum well layer includes at least one patterned layer, and the patterned layer includes multiple geometric patterns. A first type semiconductor layer is disposed on the lower surface of the quantum well structure. A second type semiconductor layer is disposed on the upper surface of the quantum well structure. A first type electrode is disposed on the epitaxial structure and electrically connected to the first type semiconductor layer. A second type electrode is disposed on the epitaxial structure and electrically connected to the second type semiconductor layer.

In summary, in the epitaxial structure of the disclosure, the quantum well layer includes at least one patterned layer, and the patterned layer includes multiple geometric patterns. With the configuration of the geometric patterns, the epitaxial structure of the disclosure can have the effects of stress adjustment and long-wavelength light emission. Furthermore, the patterned layer can also effectively reduce the piezoelectric effect to reduce the built-in electric field and reduce the interface stress, so the dopant (e.g., indium content) in the patterned layer is increased and thereby the crystal quality is maintained. For the quantum well layer, the dopant (e.g., indium content) in the quantum well layer can also be increased due to the addition of the patterned layer. In addition, with the configuration of the patterned layer and without configuration of the second semiconductor layer with a thick thickness, the epitaxial structure can have a relatively flat surface. Therefore, the epitaxial structure of the disclosure has favorable yield and quality, and the micro light emitting device using the epitaxial structure of the disclosure can have good optoelectronic properties and reliability.

In order to make the features and advantages of the disclosure comprehensible, embodiments accompanied with drawings are described in detail below.

DESCRIPTION OF THE EMBODIMENTS

Embodiments of the disclosure describe the structure of a micro light emitting device (e.g., a micro light emitting diode (Micro LED), ready for pickup and transfer to a receiving substrate. The receiving substrate may be, for example, a display substrate or other substrates with circuits, but the disclosure is not limited thereto.

Figure 1:
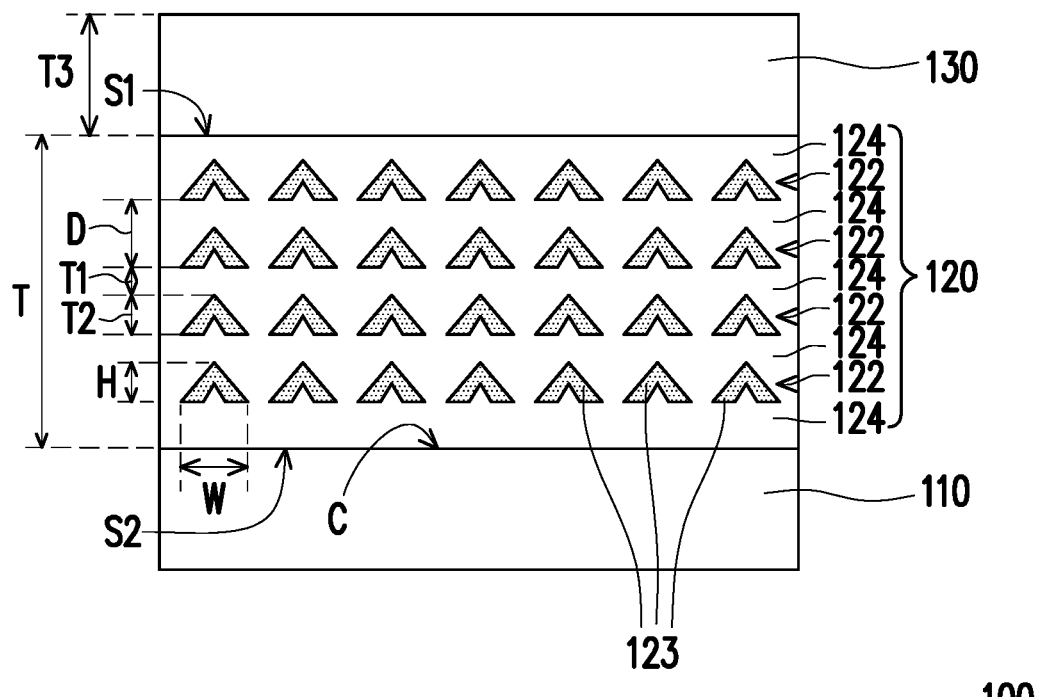
FIG. 1 is a schematic cross-sectional view of an epitaxial structure according to an embodiment of the disclosure.

FIG. 1 is a schematic cross-sectional view of an epitaxial structure according to an embodiment of the disclosure. Referring to FIG. 1, in the embodiment, an epitaxial structure 100 includes a first type semiconductor layer 110, a quantum well structure 120, and a second type semiconductor layer 130. The quantum well structure 120 has an upper surface S1 and a lower surface S2 opposite to each other and includes at least one quantum well layer and at least one quantum barrier layer stacked alternately. Meanwhile, the quantum well structure 120 is embodied as a multiple quantum well structure and includes multiple quantum well layers and multiple quantum barrier layers (five layers of quantum barrier layers 124 are schematically illustrated) stacked alternately. Specifically, the quantum well layer includes at least one patterned layer 122, and the patterned layer 122 includes multiple geometric patterns 123.

Meanwhile, the quantum well layer is embodied as four patterned layers 122 stacked alternately with the quantum barrier layers 124, but the disclosure is not limited thereto. The quantum well structure 120 is, for example, a gallium nitride (GaN)/indium gallium nitride (InGaN) multiple quantum well structure, aluminum gallium nitride (AlGaN)/indium gallium nitride (InGaN) multiple quantum well structure, aluminum Gallium Nitride (AlGaN)/Gallium Nitride (GaN) multiple quantum well structure or Indium Gallium Aluminum Nitride (AlInGaN)/Indium Gallium Nitride (InGaN) multiple quantum well structure. In the embodiment not illustrated, the quantum well structure may also be a single quantum well structure.

Furthermore, the first type semiconductor layer 110 in the embodiment is disposed on the lower surface S2 of the quantum well structure 120, and the second type semiconductor layer 130 is disposed on the upper surface S1 of the quantum well structure 120. Meanwhile, the first type semiconductor layer 110 is, for example, an N-type semiconductor layer, and the second type semiconductor layer 130 is, for example, a P-type semiconductor layer, but the disclosure is not limited thereto.

Specifically, referring to FIG. 1 again, in the embodiment, the geometric patterns 123 in each patterned layer 122 are separated from one another, and the geometric patterns 123 in two adjacent patterned layers 122 are aligned. That is, the patterned layer 122 is embodied as a discontinuously patterned layer. In an embodiment not illustrated, the geometric patterns 123 in each patterned layer 122 may also be partially separated from one another. In a cross-sectional view, each geometric pattern 123 is, for example, pyramid-shaped, but the disclosure is not limited thereto. In other embodiments, the cross-sectional shape of the geometric pattern 123 can also be wavy or zigzag, and this still falls within the scope of the disclosure. Referring to FIG. 1 again, each geometric pattern 123 has a height H, and the quantum well structure 120 has a thickness T. Preferably, the ratio of the height H to the thickness T is greater than or equal to 0.1 and less than or equal to 0.5. A first thickness T1 of each quantum barrier layer 124 is greater than or equal to a half of a second thickness T2 of the patterned layer 122. Meanwhile, the first thickness T1 of the quantum barrier layers 124 is the minimum distance between any two adjacent patterned layers 122. Preferably, the first thickness T1 is less than the second thickness T2. In addition, a maximum vertical distance D between two adjacent quantum well layers (i.e., the patterned layer 122) preferably ranges from 2.5 nm to 50 nm. If the maximum vertical spacing D is less than 2.5 nm, the stress adjustment effect is not good; on the contrary, if the maximum vertical spacing D is greater than 50 nm, the quality of the epitaxial crystal may be poor.

As shown in FIG. 1, the first type semiconductor layer 110 of the embodiment has a surface C, and the lower surface S2 of the quantum well structure 120 is adjacent to the surface C. Preferably, the ratio of the orthographic projection area of the geometric pattern 123 on the surface C to the area of the surface C is greater than 0.25, which can contribute to stress adjustment function. In addition, a thickness T3 of the second type semiconductor layer 130 in the embodiment is, for example, greater than or equal to 10 nm and less than 200 nm. Meanwhile, the second type semiconductor layer 130 is in direct contact with the quantum well structure 120, and the second type semiconductor layer 130 is, for example, a gallium nitride (GaN) layer. Compared with the related art in which a SixNy mask is fabricated through an additional exposure and development process for selective epitaxial crystal growth, and in the subsequent epitaxial process of the quantum well structure, a P-type semiconductor layer with a thickness of at least 250 nm to 500 nm has to be used to flatten the surface of the epitaxial structure, the thickness T3 of the second type semiconductor layer 130 in the embodiment is obviously thinner, the thickness can be reduced by at least half, and the interface can be quickly flattened, thereby reducing the thickness of the entire epitaxial structure 100.

In short, in the epitaxial structure 100 of the embodiment, the quantum well structure 120 is embodied as a multiple quantum well structure, the quantum well layer is embodied as the patterned layer 122, and the patterned layer 122 includes multiple geometric patterns 123. With the configuration of these geometric patterns 123, the epitaxial structure 100 of the embodiment can have the effects of stress regulation and long-wavelength light emission, and with the design of these geometric patterns 123, multiple quantum well layers and multiple quantum barrier layers 124 are grown and have favorable light-emitting effect. Furthermore, the patterned layer 122 can also effectively reduce the piezoelectric effect, so as to reduce the built-in electric field and reduce the interface stress, so as to increase the dopant (e.g., indium content) in the patterned layer 122, thereby maintaining the crystal quality. For the quantum well layer 120, the dopant (e.g., indium content) in the quantum well layer 120 can be increased due to the addition of the patterned layer 122. In addition, with the configuration of the patterned layer 122, the thickness T3 of the second type semiconductor layer 130 does not need to be too thick, so that the epitaxial structure 100 can have a relatively flat surface. Therefore, the epitaxial structure 100 of the embodiment has favorable yield and quality, and a micro light emitting device 10 using the epitaxial structure 100 can have good optoelectronic properties and reliability.

It should be noted here that the following embodiments adopt the reference numbers and partial contents of the foregoing embodiments, wherein the same reference numbers are used to indicate the same or similar elements, and the description of the same technical content is omitted. For the description of the omitted parts, reference may be made to the foregoing embodiments, and the same content will not be iterated in the following embodiments.

FIG. 2A to FIG. 2J are schematic cross-sectional views of multiple epitaxial structures according to various embodiments of the disclosure. First, referring to both FIG. 1 and FIG. 2A, an epitaxial structure 100a of the embodiment is similar to the epitaxial structure 100 of FIG. 1. What differs is that in the embodiment, the quantum well layer in a quantum well structure 120a includes one patterned layer 122a and three continuous layers 126, and the quantum barrier layer 124, the patterned layer 122a, and the continuous layers 126 are stacked alternately. Meanwhile, the patterned layer 122a is adjacent to the first type semiconductor layer 110, the continuous layers 126 are adjacent to the second type semiconductor layer 130, and with this configuration, stress is adjusted, thereby increasing the luminous efficiency of the quantum well structure 120a. In addition, in the embodiment, the material of the quantum well layer is, for example, indium gallium nitride, and the ratio of the doping concentration of indium in the patterned layer 122a to the doping concentration of indium in the continuous layer 126 ranges from 0.1 to 3.5, which can contribute to stress adjustment function and epitaxial crystal quality. Meanwhile, the doping concentration of indium in the patterned layer 122a ranges from 4% to 50%, while the doping concentration of indium in the continuous layer 126 ranges from 15% to 25%. When there is too little concentration, the luminous efficiency is poor; when there is too much concentration, defects in the epitaxial structure growth may increase.

Figure 2A:
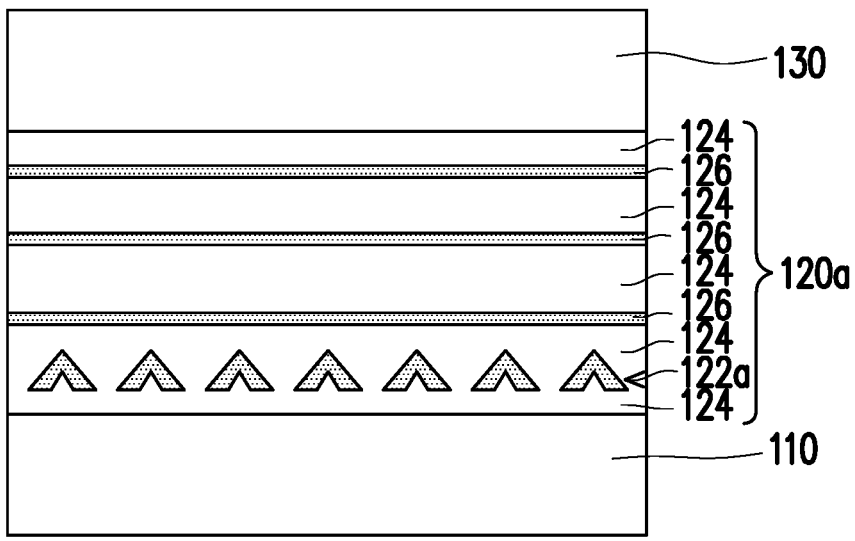
FIG. 2A to FIG. 2J are schematic cross-sectional views of multiple epitaxial structures according to various embodiments of the disclosure.
Figure 2B:
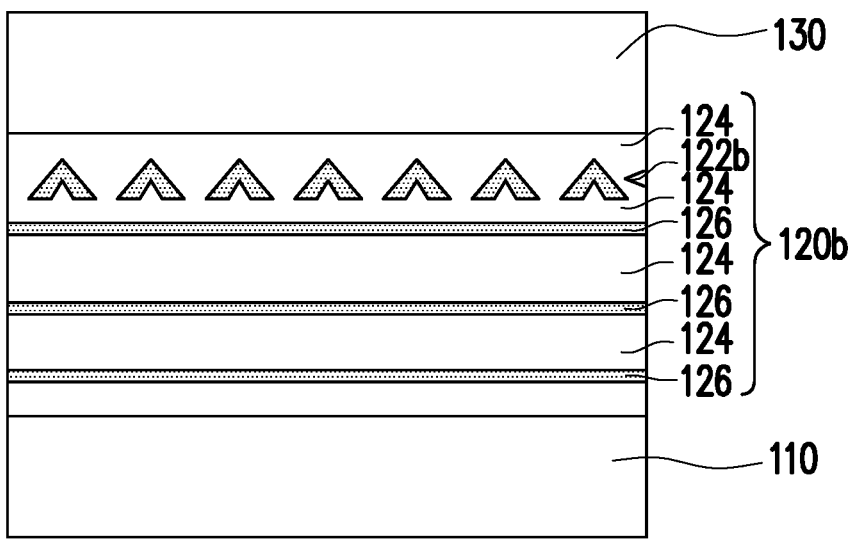

Next, referring to both FIG. 1 and FIG. 2B, an epitaxial structure 100b of the embodiment is similar to the epitaxial structure 100 of FIG. 1. What differs is that in the embodiment, the quantum well layer in the quantum well structure 120b includes one patterned layer 122b and three continuous layers 126, and the quantum barrier layer 124, the continuous layers 126, and the patterned layer 122b are stacked alternately. Meanwhile, the continuous layers 126 are adjacent to the first type semiconductor layer 110, and the patterned layer 122b is adjacent to the second type semiconductor layer 130, and with the configuration, the quantum well structure 120b is allowed to emit light with long-wavelength. In addition, in the embodiment, the material of the quantum well layer is, for example, indium gallium nitride, and the ratio of the doping concentration of indium in the patterned layer 122b to the doping concentration of indium in the continuous layer 126 ranges from 0.1 to 3.5, which can contribute to stress adjustment function and epitaxial crystal quality. Meanwhile, the doping concentration of indium in the patterned layer 122b ranges from 4% to 50%, while the doping concentration of indium in the continuous layer 126 ranges from 15% to 25%. When there is too little concentration, the luminous efficiency is poor; when there is too much concentration, defects in the epitaxial structure growth may increase.

Figure 2C:
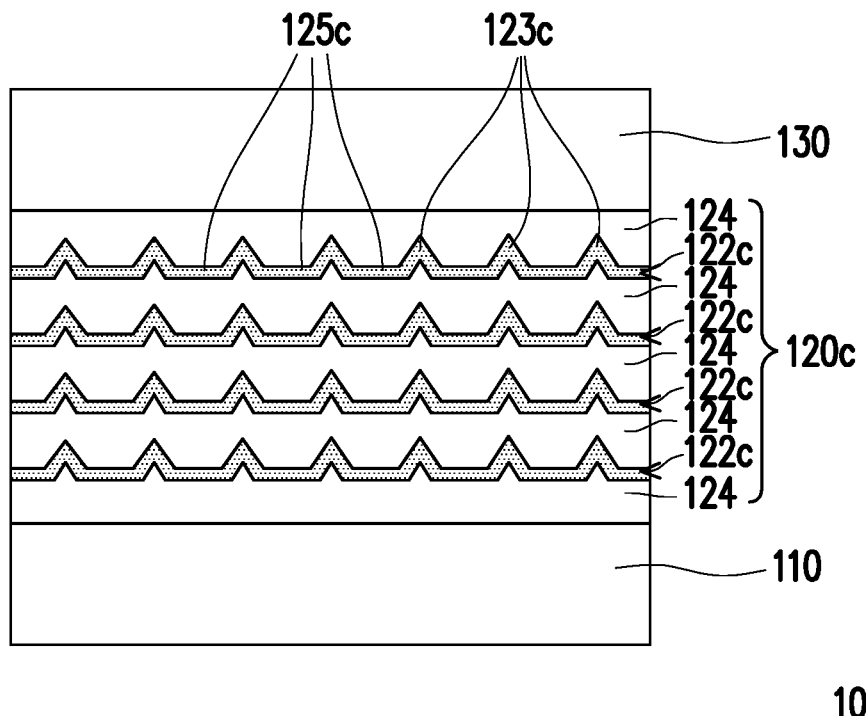

Next, referring to both FIG. 1 and FIG. 2C, an epitaxial structure 100c of the embodiment is similar to the epitaxial structure 100 of FIG. 1. What differs is that in the embodiment, the quantum well layers in the quantum well structure 120c are four patterned layers 122c, each patterned layer 122c includes multiple connecting portions 125c in addition to the geometric patterns 123c, each connecting portion 125c is located between two adjacent geometric patterns 123c, and each connecting portion 125c connects two adjacent geometric patterns 123c. That is, the patterned layer 122c is embodied as a continuous patterned layer, which can contribute to stress adjustment function. However, in an embodiment not illustrated, since PSS substrate is currently used as a growth substrate, corresponding to the growth of the patterned substrate, the connecting portion may only connect part of two adjacent geometric patterns. Alternatively, the part of the patterned layer is a continuous patterned layer, and the connection part of the part of the patterned layer only connects part of two adjacent geometric patterns, which can have a between stress adjustment function.

Figure 2D:
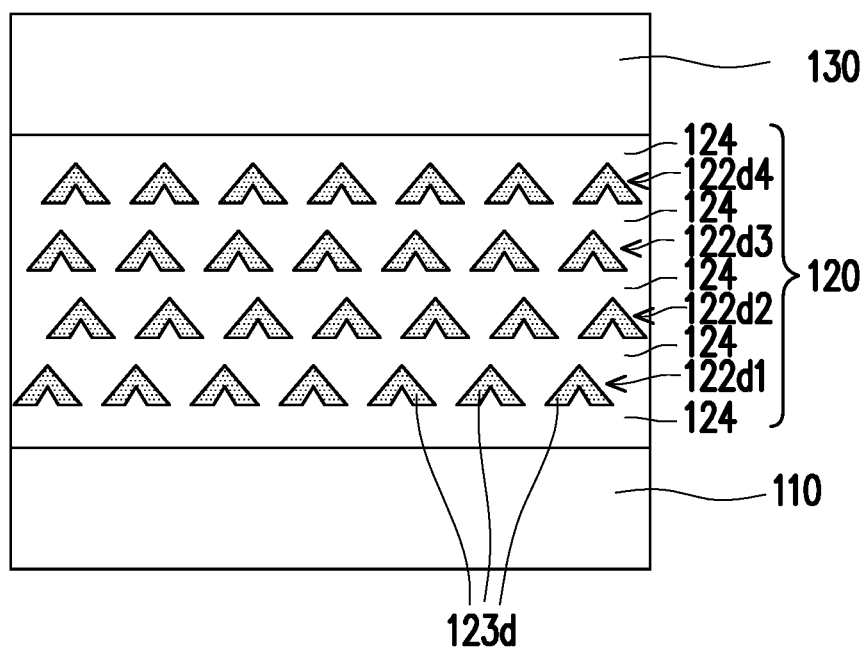

Next, referring to both FIG. 1 and FIG. 2D, an epitaxial structure 100d of the embodiment is similar to the epitaxial structure 100 of FIG. 1. What differs is that in the embodiment, the quantum well layers in the quantum well structure 120d are four patterned layers 122d1, 122d2, 122d3, and 122d4; and the geometric patterns 123d in the any two adjacent patterned layers from the patterned layers 122d1, 122d2, 122d3, and 122d4 are at least partially dislocated, which can effectively block the dislocation density in the epitaxial process. In an embodiment not illustrated, the geometric patterns in the two adjacent patterned layers are completely dislocated, which can effectively block the dislocation density in the epitaxial process.

Figure 2E:
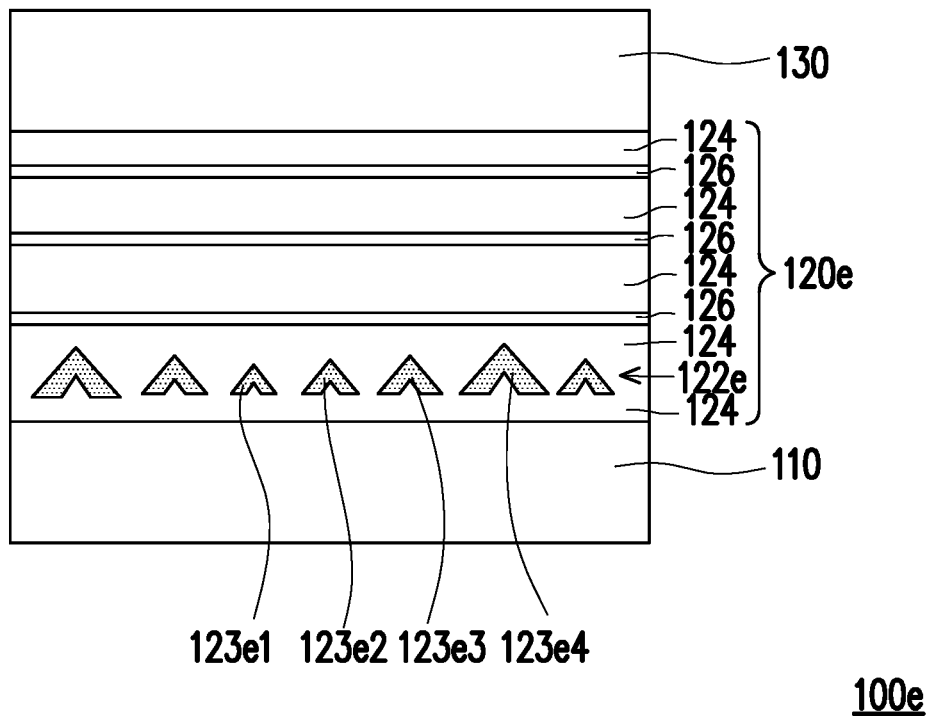

Next, referring to both FIG. 2A and FIG. 2E, an epitaxial structure 100e of the embodiment is similar to the epitaxial structure 100a of FIG. 2A. What differs is that in the embodiment, at least two of the geometric patterns 123e1, 123e2, 123e3, and 123e4 in the patterned layer 122e of the quantum well structure 120e are in different sizes. Meanwhile, the size of the geometric pattern 123e4 is larger than the size of the geometric pattern 123e3, the size of the geometric pattern 123e3 is larger than the size of the geometric pattern 123e2, and the size of the geometric pattern 123e2 is larger than the size of the geometric pattern 123e1. That is, the sizes of the geometric patterns are arranged non-periodically, which can effectively balance the uniformity of each region of the epitaxial structure and have stress adjustment function as well.

Figure 2F:
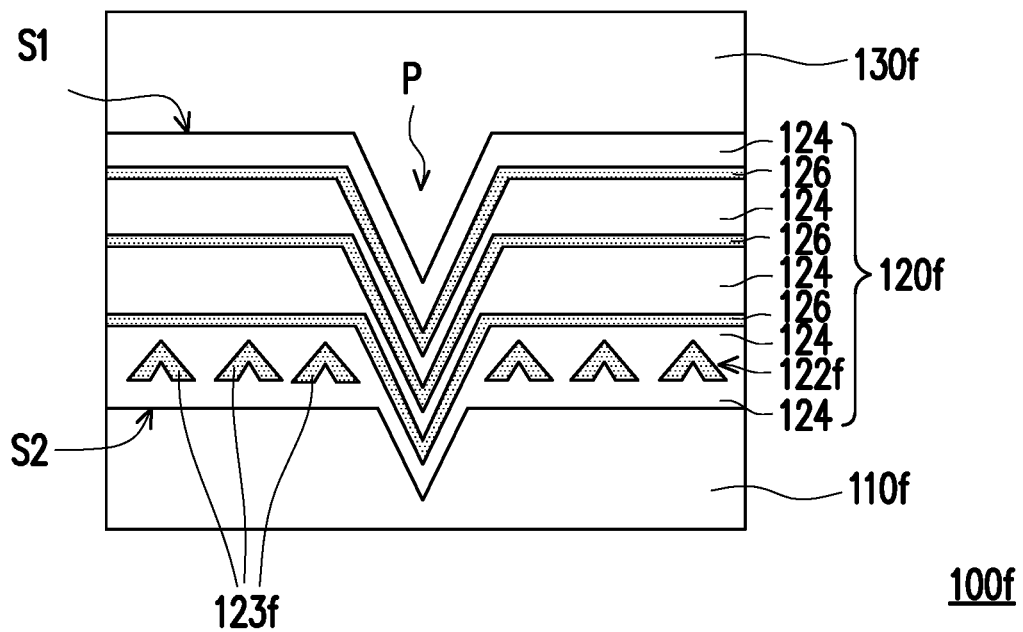

Referring to both FIG. 2A and FIG. 2F, an epitaxial structure 100f of the embodiment is similar to the epitaxial structure 100a of FIG. 2A. What differs is that in the embodiment, the epitaxial structure 100f further includes at least one V-shaped defect P in a quantum well structure 120f. Meanwhile, the at least one V-shaped defect P extends from the upper surface Si of the quantum well structure 120f to a first type semiconductor layer 110f. As shown in FIG. 2F, the V-shaped defect P is formed at the interface of a second type semiconductor layer 130f and the quantum barrier layer 124, extending downwards from the upper surface S1 to the first type semiconductor layer 110f, and thus passing through a patterned layer 122f. Meanwhile, the ratio of the size of each geometric pattern 123f in the patterned layer 122f to the size of the V-shaped defect P is less than or equal to 0.5 and is, for example, a maximum height of the geometric pattern 123f and the V-shaped defect P. In addition, the number of the geometric patterns 123f is greater than the number of the V-shaped defects P. The ratio of the number of V-shaped defects P to the number of geometric patterns 123f is less than or equal to 0.1. When there are too many V-shaped defects P, defects may increase during the growth of the epitaxial structure. Meanwhile, the number of the embodied geometric patterns 123f is six, and the number of the embodied V-shaped defects P is one, but the disclosure is not limited thereto.

Figure 2G:
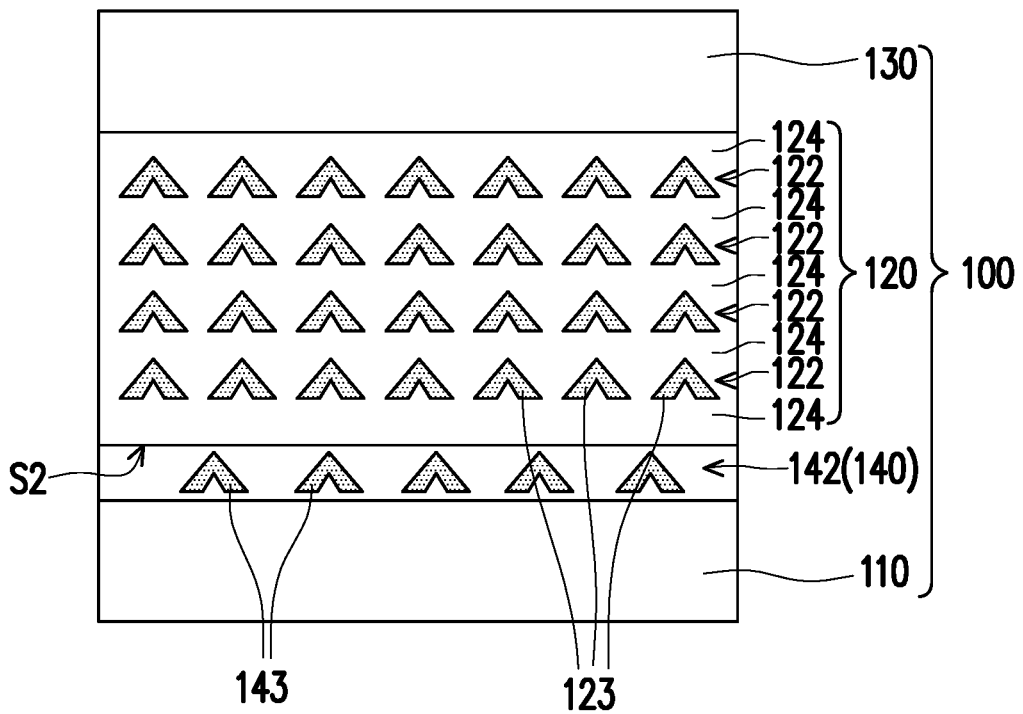

Referring to both FIG. 1 and FIG. 2G, an epitaxial structure 100g of the embodiment is similar to the epitaxial structure 100 of FIG. 1. What differs is that in the embodiment, the epitaxial structure 100g further includes a buffer layer 140, and the buffer layer 140 is disposed between the lower surface S2 of the quantum well structure 120 and the first type semiconductor layer 110. By configuring the buffer layer 140, in the epitaxial growth process, no additional exposure and development process are required to fabricate a silicon nitride mask for selective epitaxial growth, thereby preventing the negative effect of interrupting the epitaxial growth. Meanwhile, the material of the buffer layer 140 is, for example, a superlattice structure including at least two of aluminum gallium nitride (AlGaN), gallium nitride (GaN), and indium gallium nitride (InGaN); alternatively, an indium gallium nitride layer, an aluminum gallium nitride layer or a gallium nitride layer. In addition, the buffer layer 140 of the embodiment includes at least one structured layer 142, and the structured layer 142 includes multiple geometric structures 143, which can increase stress adjustment. In another embodiment not illustrated, the buffer layer requires no structured layer, which still falls within the scope of the disclosure.

Figure 2H:
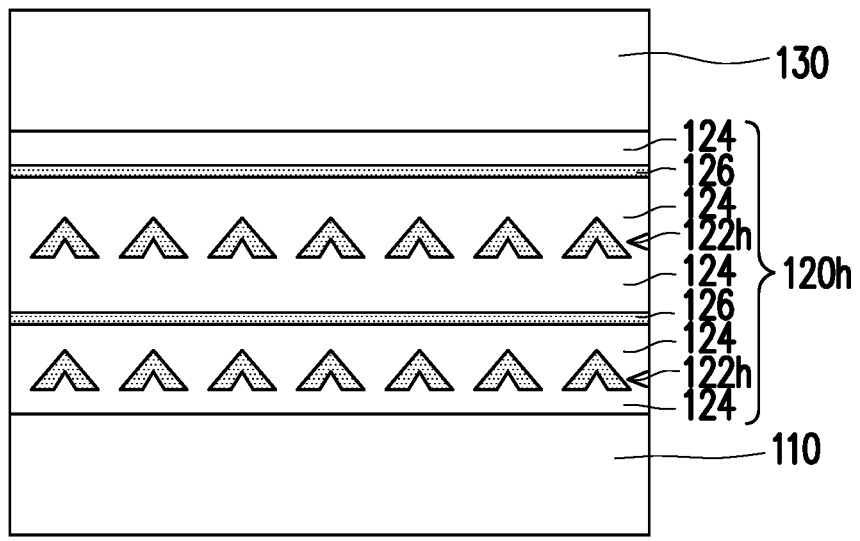

Referring to both FIG. 2A and FIG. 2H, an epitaxial structure 100h of the embodiment is similar to the epitaxial structure 100a of FIG. 2A. What differs is that in the embodiment, the patterned layers 122h and the continuous layers 126 of a quantum well structure 120h are disposed in a staggered manner, which can improve the quality of the epitaxial crystal. Preferably, the quantum well layer closest to the second type semiconductor layer 130 is the patterned layer 122h, so that the second type semiconductor layer 130 grown subsequently has good epitaxial crystal quality. In an embodiment not illustrated, the continuous layer, the patterned layer, and the patterned layer can also be disposed alternately according to actual design requirements.

Figure 2I:
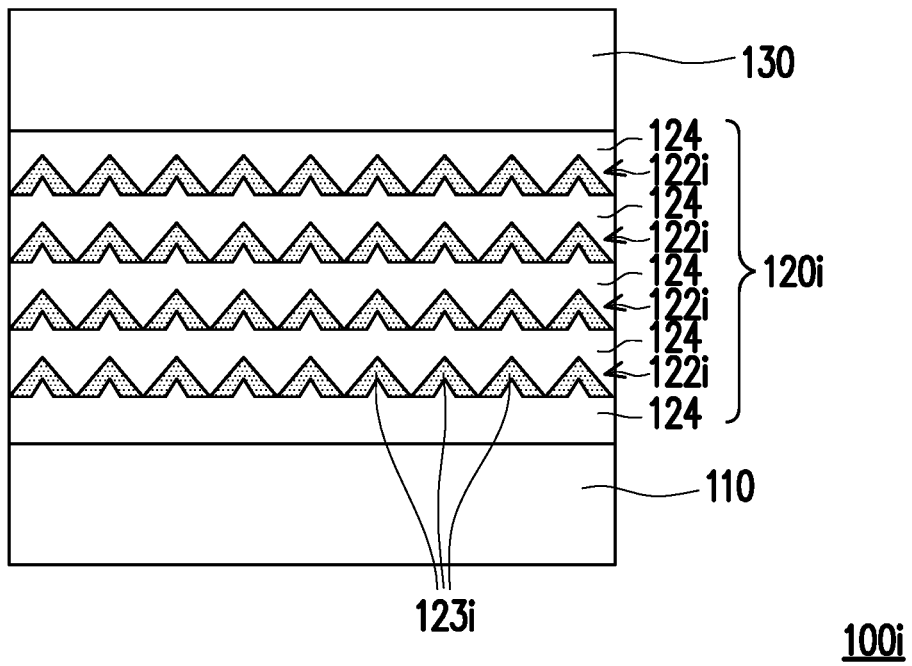

Referring to both FIG. 1 and FIG. 2I, an epitaxial structure 100i of the embodiment is similar to the epitaxial structure 100 of FIG. 1. What differs is that in the embodiment, the quantum well layers in a quantum well structure 120i are four patterned layers 122i, and the geometric patterns 123i of each patterned layer 122i are connected together. That is, the patterned layer 122i of the embodiment is embodied as a continuous patterned layer, which can contribute to stress adjustment function.

Figure 2J:
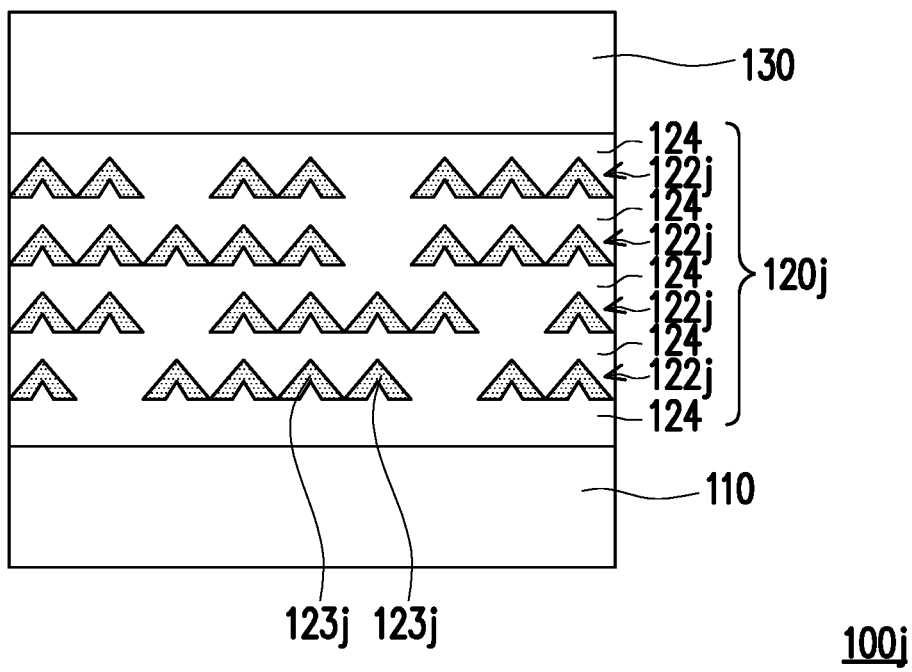

Referring to both FIG. 2I and FIG. 2J, an epitaxial structure 100j of the embodiment is similar to the epitaxial structure 100i of FIG. 2I. What differs is that in the embodiment, the quantum well layers in the quantum well structure 120j are four patterned layers 122j, and part of the geometric patterns 123j of each patterned layer 122j are connected together. That is, the patterned layer 122j of the embodiment is embodied as a discontinuous patterned layer.

Figure 3A:
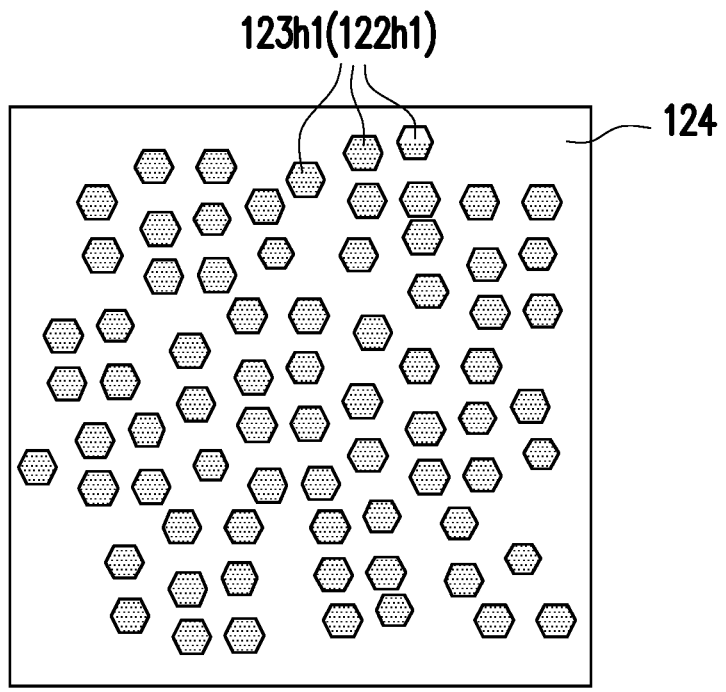
FIG. 3A to FIG. 3D are schematic top views of multiple patterned layers of a quantum well structure according to an embodiment of the disclosure.
Figure 3B:
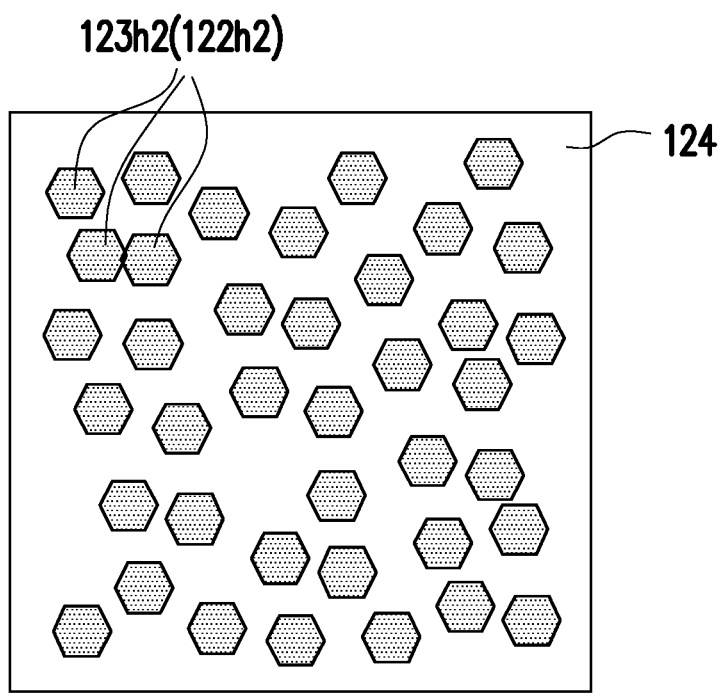
Figure 3C:
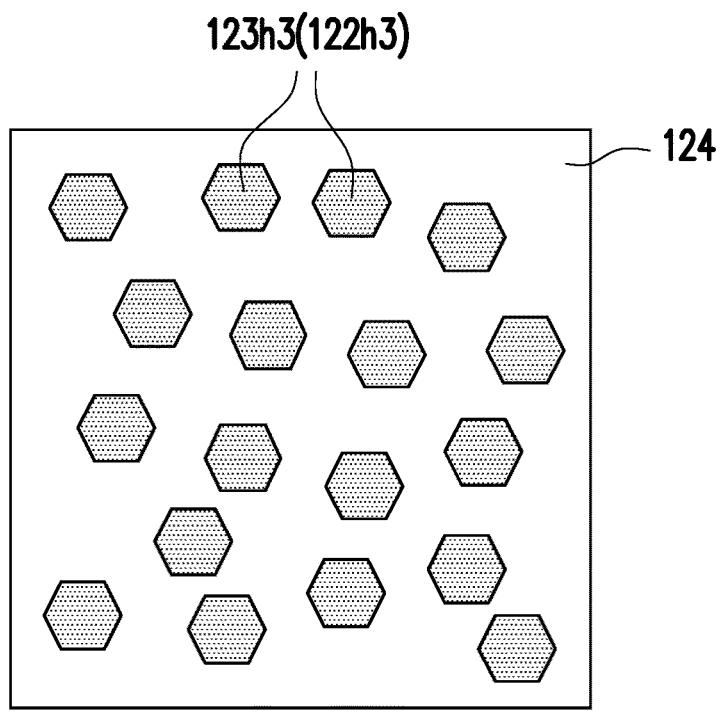
Figure 3D:
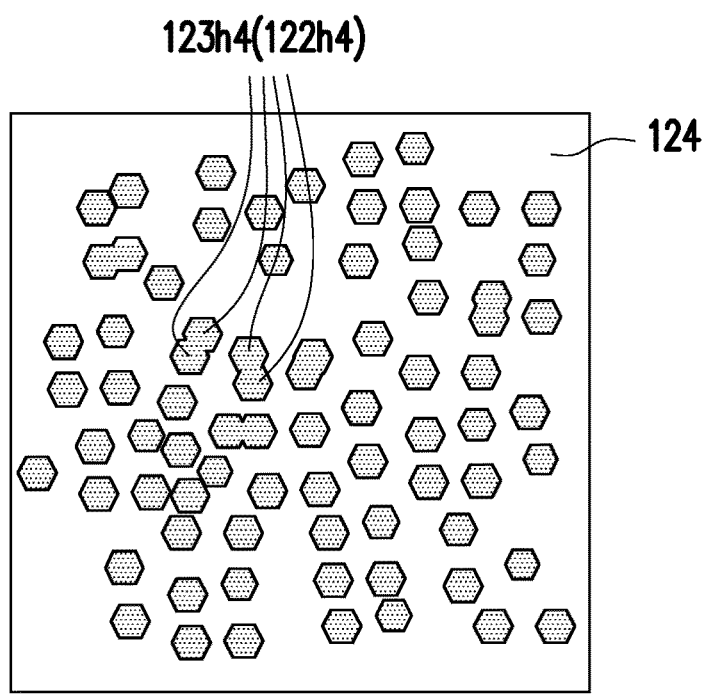
Figure 4:
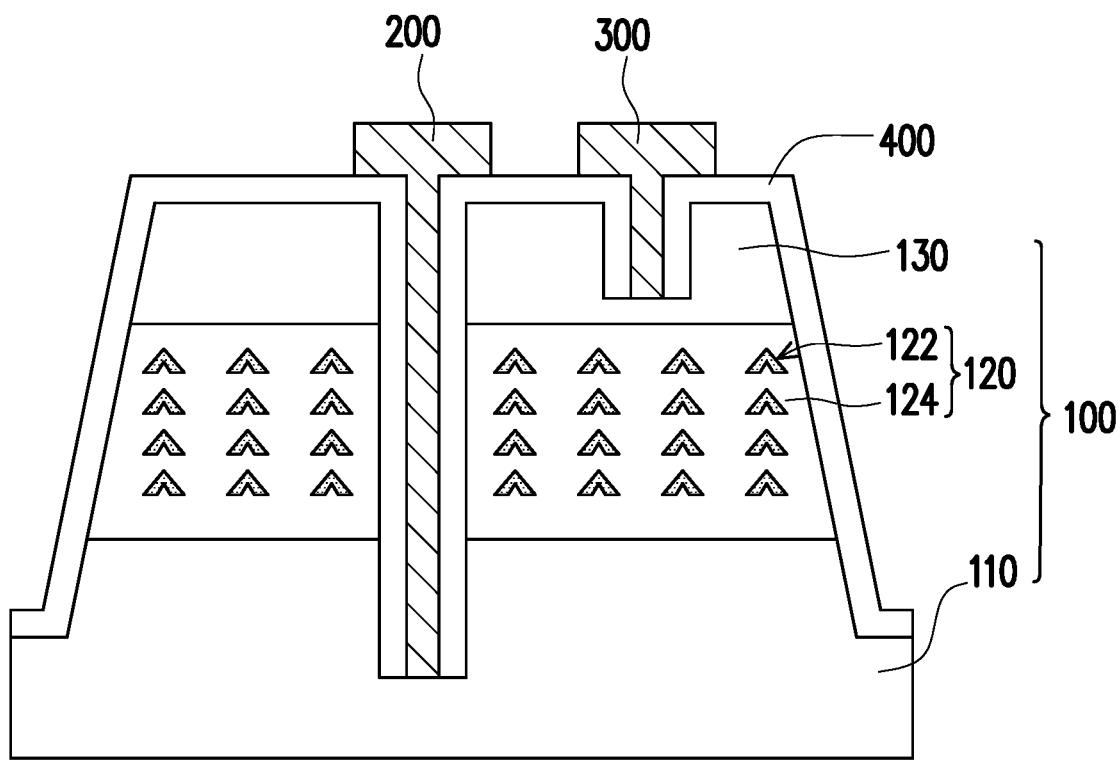
FIG. 4 is a schematic cross-sectional view of a micro light emitting device according to an embodiment of the disclosure.

FIG. 3A to FIG. 3D are schematic top views of multiple patterned layers of a quantum well structure according to an embodiment of the disclosure. Referring to FIG. 1, FIG. 3A, FIG. 3B, FIG. 3C, and FIG. 3D all together, the quantum well structure of the embodiment is similar to the quantum well structure 120 of FIG. 1. What differs is that in the embodiment, the distribution densities of the geometric patterns 123h1, 123h2, 123h3 and 123h4 in each of the patterned layers 122h1, 122h2, 122h3 and 122h4 are different. Furthermore, in the embodiment, as shown in FIG. 3A, the distribution density of the geometric pattern 123h1 is, for example, $2 \times 10^{11}$ when the height (refer to the height H in FIG. 1) of the geometric pattern 123h1 is, for example, 2.5 nm, and the width (refer to the width W in FIG. 1) is, for example, 5 nm. On the other hand, as shown in FIG. 3C, the distribution density of the geometric pattern 123h3 is, for example, $1 \times 10^{10}$ when the height (refer to the height H in FIG. 1) of the geometric pattern 123h3 is, for example, 125 nm, and the width (refer to the width W in FIG. 1) is, for example, 150 nm. The smaller the size of the geometric pattern 123h3, the larger the division density. Thereby, the stress generated is adjusted in the epitaxial process. Epitaxial structures with different sizes and light colors have different distribution densities, which can effectively adjust the stress to increase the quality of the epitaxial crystals and contribute to luminous uniformity. Note that when the epitaxial structure is subsequently processed to form the micro light emitting device 10 as shown in FIG. 4, when the maximum width of the micro light emitting device 10 is less than or equal to 50 μm, the distribution density of the geometric pattern 123h3 is greater than or equal to $1 \times 10^{10}$ and less than or equal to $2 \times 10^{11}$, which can contribute to luminous efficiency. In addition, when overseen, the maximum distance between any two adjacent geometric patterns 123h1, 123h2, and 123h3 is less than or equal to 0.5 μm, so that a good stress adjustment capability can be achieved. The spacing between some of the geometric patterns 123h4 is zero, that is, some of the geometric patterns 123h4 are connected to one another, and no spacing is therebetween as shown in FIG. 3D.

FIG. 4 is a schematic cross-sectional view of a micro light emitting device according to an embodiment of the disclosure. Referring to both FIG. 1 and FIG. 4, in the embodiment, the micro light emitting device 10 includes the epitaxial structure 100 of FIG. 1, a first type electrode 200, and a second type electrode 300. The first type electrode 200 is disposed on the epitaxial structure 100 and electrically connected to the first type semiconductor layer 110. The second type electrode 300 is disposed on the epitaxial structure 100 and electrically connected to the second type semiconductor layer 130. In addition, the micro light emitting device 10 of the embodiment further includes an insulating layer 400 disposed on the second type semiconductor layer 130, and the first type electrode 200 and the second type electrode 300 are located in the insulating layer 400 and electrically connected to the first type semiconductor layer 110 and the second type semiconductor layer 130 respectively. That is, the micro light emitting device 10 of the embodiment is embodied as a flip-chip micro light emitting device. In an embodiment not illustrated, the micro light emitting device 10 may also be a vertical micro light emitting device or a horizontal type micro light emitting device.

In summary, in the epitaxial structure of the disclosure, the quantum well layer includes at least one patterned layer, and the patterned layer includes multiple geometric patterns. With the configuration of the geometric patterns, the epitaxial structure of the disclosure can have the effects of stress adjustment and long-wavelength light emission. Furthermore, the patterned layer can also effectively reduce the piezoelectric effect to reduce the built-in electric field and reduce the interface stress, so the dopant (e.g., indium content) in the patterned layer is increased and thereby the crystal quality is maintained. In addition, with the configuration of the patterned layer and without configuration of the second semiconductor layer with a thick thickness, the epitaxial structure can have a relatively flat surface. Therefore, the epitaxial structure of the disclosure has favorable yield and quality, and the micro light emitting device using the epitaxial structure of the disclosure can have good optoelectronic properties and reliability.

Although the disclosure has been described with reference to the above embodiments, they are not intended to limit the disclosure. It will be apparent to one of ordinary skill in the art that modifications and changes to the described embodiments may be made without departing from the spirit and the scope of the disclosure. Accordingly, the scope of the disclosure will be defined by the attached claims and their equivalents and not by the above detailed descriptions.

What is claimed is:

1. An epitaxial structure, comprising:
a quantum well structure having an upper surface and a lower surface opposite to each other and comprising at least one quantum well layer and at least one quantum barrier layer stacked alternately, wherein the at least one quantum well layer comprises at least one patterned layer, and the at least one patterned layer comprises a plurality of geometric patterns;
a first type semiconductor layer disposed on the lower surface of the quantum well structure;
a second type semiconductor layer disposed on the upper surface of the quantum well structure; and
at least one V-shaped defect in the quantum well structure, wherein one of the at least one V-shaped defect is formed at an interface of the second type semiconductor layer and the at least one quantum barrier layer and passes through one of the at least one patterned layer, and another one of the at least one V-shaped defect penetrates into a top surface of, the first type semiconductor layer.

2. The epitaxial structure according to claim 1, wherein the at least one quantum well layer comprises at least one continuous layer, and a ratio of doping concentration of indium in the at least one patterned layer to doping concentration of indium in the at least one continuous layer ranges from 0.1 to 3.5.

3. The epitaxial structure according to claim 2, wherein the doping concentration of indium in the at least one patterned layer ranges from 4% to 50%, and the doping concentration of indium in the at least one continuous layer ranges from 15% to 25%.

4. The epitaxial structure according to claim 2, wherein one of the at least one patterned layer and the at least one continuous layer is adjacent to the first type semiconductor layer, and the other of the at least one patterned layer and the at least one continuous layer is adjacent to the second type semiconductor layer.

5. The epitaxial structure according to claim 1, wherein at least two of the plurality of geometric patterns are in different sizes.

6. The epitaxial structure according to claim 1, wherein the at least one patterned layer further comprises a plurality of connecting portions, each of the plurality of connecting portions is located between adjacent two of the plurality of geometric patterns, and each of the plurality of connecting portions at least connects adjacent two of the plurality of geometric patterns.

7. The epitaxial structure according to claim 1, wherein the at least one patterned layer comprises a plurality of patterned layers, the plurality of geometric patterns in each of the plurality of patterned layers are at least partially separated from one another, and the plurality of geometric patterns in adjacent two of the plurality of patterned layers are at least partially dislocated.

8. The epitaxial structure according to claim 7, wherein distribution densities of the plurality of geometric patterns in at least two of the plurality of patterned layers are different.

9. The epitaxial structure according to claim 1, further comprising:

a buffer layer disposed between the lower surface of the quantum well structure and the first type semiconductor layer, wherein the buffer layer comprises at least one structured layer, and the at least one structured layer comprises a plurality of geometric structures.

10. The epitaxial structure according to claim 1, wherein a ratio of a size of each of the plurality of geometric patterns to a size of the at least one V-shaped defect is less than or equal to 0.5.

11. The epitaxial structure according to claim 1, wherein a number of the plurality of geometric patterns is greater than a number of the at least one V-shaped defect.

12. The epitaxial structure according to claim 11, wherein a ratio of the number of the at least one V-shaped defect to the number of the plurality of geometric patterns is less than or equal to 0.1.

13. The epitaxial structure according to claim 1, wherein the first type semiconductor layer has a surface, the lower surface of the quantum well structure is adjacent to the surface, and a ratio of an orthographic projection area of the plurality of geometric patterns on the surface to an area of the surface is greater than 0.25.

14. The epitaxial structure according to claim 1, wherein each of the plurality of geometric patterns has a height, the quantum well structure has a thickness, and a ratio of the height to the thickness is greater than or equal to 0.1 and less than or equal to 0.5.

15. The epitaxial structure according to claim 1, wherein when overseen, a maximum distance between adjacent any two of the plurality of geometric patterns is less than or equal to 0.5 µm.

16. The epitaxial structure according to claim 1, wherein the at least one quantum well layer comprises two quantum well layers, and a vertical distance between adjacent the quantum well layers ranges from 2.5 nm to 50 nm.

17. The epitaxial structure according to claim 1, wherein a first thickness of the at least one quantum barrier layer is greater than or equal to a half of a second thickness of the patterned layer.

18. The epitaxial structure according to claim 1, wherein a thickness of the second type semiconductor layer is greater than or equal to 10 nm and less than 200 nm.

* * * * *